US010644178B2

(12) United States Patent
Yoshikawa et al.

(10) Patent No.: US 10,644,178 B2
(45) Date of Patent: May 5, 2020

(54) SOLAR BATTERY AND SOLAR BATTERY MODULE

(71) Applicant: Kaneka Corporation, Osaka (JP)

(72) Inventors: Kunta Yoshikawa, Osaka (JP); Kunihiro Nakano, Osaka (JP); Hayato Kawasaki, Osaka (JP); Katsunori Konishi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 15/710,343

(22) Filed: Sep. 20, 2017

(65) Prior Publication Data

US 2018/0062012 A1 Mar. 1, 2018

Related U.S. Application Data

(63) Continuation of application No. PCT/JP2016/060180, filed on Mar. 29, 2016.

(30) Foreign Application Priority Data

Mar. 31, 2015 (JP) ................................ 2015-074452

(51) Int. Cl.
*H01L 31/0465* (2014.01)
*H01L 31/05* (2014.01)
(Continued)

(52) U.S. Cl.
CPC ...... *H01L 31/0465* (2014.12); *H01L 31/0224* (2013.01); *H01L 31/022441* (2013.01);
(Continued)

(58) Field of Classification Search
CPC ............ H01L 31/0516; H01L 31/0504; H01L 31/0508; H01L 31/0682; H01L 31/022441;
(Continued)

(56) References Cited

U.S. PATENT DOCUMENTS 8,828,784 B2 9/2014 Kommera et al.
2004/0112424 A1* 6/2004 Araki .................. H01L 31/052
136/256

(Continued)

FOREIGN PATENT DOCUMENTS

CN 102282678 A 12/2011
JP 2009200267 A 9/2009

(Continued)

OTHER PUBLICATIONS

Extended European Search Report issued in European Application No. 16772858.3, dated Nov. 6, 2018 (8 pages).

(Continued)

*Primary Examiner* — Andrew J Golden
(74) *Attorney, Agent, or Firm* — Osha Liang LLP

(57) ABSTRACT

A solar cell includes: first conductivity-type layers and second conductivity-type layers each provided on a rear surface of a semiconductor substrate; first electrodes provided on the first conductivity-type layers; and second electrodes provided on the second conductivity-type layers. The first electrodes and the second electrodes are spaced apart from each other, and the first electrodes include a plurality of regions isolated from one another by the second electrodes disposed therebetween. Each of the plurality of regions of the first electrodes includes a non-mounting electrode section and a wiring-mounting electrode section having a larger electrode height than the non-connection electrode section. In two adjacent first electrode regions, an imaginary line connecting the top of the wiring-mounting electrode section of one of the regions and the top of the wiring-mounting electrode section of the other region does not cross the second electrode disposed between the two regions.

10 Claims, 12 Drawing Sheets

(51) Int. Cl.
*H01L 31/0224* (2006.01)
*H01L 31/0747* (2012.01)
*H01L 31/068* (2012.01)

(52) U.S. Cl.
CPC ...... *H01L 31/0516* (2013.01); *H01L 31/0747* (2013.01); *H01L 31/022433* (2013.01); *H01L 31/0682* (2013.01); *Y02E 10/50* (2013.01)

(58) Field of Classification Search
CPC ..... H01L 31/022433; H01L 31/022458; H01L 31/02363; H01L 31/0201; H01L 31/0747; H01L 31/0465
USPC .................................................. 136/243–265
See application file for complete search history.

(56) References Cited

U.S. PATENT DOCUMENTS

| | | | | |
|---|---|---|---|---|
| 2010/0031999 | A1* | 2/2010 | Mishima | H01L 31/0516 136/244 |
| 2012/0012173 | A1* | 1/2012 | Kim | H01L 31/022433 136/256 |
| 2012/0031457 | A1 | 2/2012 | Taira et al. | |
| 2012/0216860 | A1* | 8/2012 | Sainoo | H01L 31/0516 136/256 |
| 2013/0180585 | A1 | 7/2013 | Goto et al. | |
| 2013/0240023 | A1* | 9/2013 | Sewell | H01L 31/022441 136/251 |
| 2013/0276859 | A1 | 10/2013 | Mishima | |
| 2014/0196783 | A1 | 7/2014 | Tohoda | |
| 2014/0354323 | A1 | 12/2014 | Hishikawa et al. | |
| 2014/0370651 | A1 | 12/2014 | Tochihara et al. | |
| 2015/0171240 | A1* | 6/2015 | Kapur | H01L 31/022441 438/72 |
| 2016/0118515 | A1 | 4/2016 | Mori et al. | |
| 2016/0380120 | A1* | 12/2016 | Terao | H01L 31/0504 136/244 |

FOREIGN PATENT DOCUMENTS

| | | | |
|---|---|---|---|
| JP | 2010092981 | A | 4/2010 |
| JP | 2011-003724 | A | 1/2011 |
| JP | 2012138545 | A | 7/2012 |
| JP | 201330601 | A | 2/2013 |
| JP | 2013175634 | A | 9/2013 |
| JP | 2014127507 | A | 7/2014 |
| JP | 2015-015879 | A | 1/2015 |
| WO | 2012014983 | A1 | 2/2012 |
| WO | 2013133005 | A1 | 9/2013 |
| WO | 2014196307 | A1 | 12/2014 |

OTHER PUBLICATIONS

Office Action issued in Chinese Application No. 201680004555.0, dated Aug. 2, 2018 (26 pages).

International Search Report issued in International Application No. PCT/JP2016/060180; dated Jun. 7, 2016 (2 pages).

International Preliminary Report on Patentability issued in International Application No. PCT/JP2016/060180; dated Oct. 12, 2017 (6 pages).

Office Action issued in Japanese Application No. 2017-510040, dated Dec. 3, 2019 (10 pages).

* cited by examiner

SOLAR BATTERY AND SOLAR BATTERY MODULE

TECHNICAL FIELD

The present invention relates to a solar cell and a solar cell module. The present invention also relates to a solar cell test method and a method for manufacturing a solar cell module.

BACKGROUND ART

A general solar cell is a double-sided electrode type solar cell, which includes an electrode on both a light-receiving surface and a back surface. As a solar cell free from a shading loss caused by an electrode, a back contact solar cell has been developed (e.g. Patent Document 1). Since a back contact solar cell includes an electrode only on a back surface, the back contact solar cell is free from a shading loss caused by a metal electrode on a light-receiving surface, and is thus expected to exhibit high conversion efficiency.

A back contact solar cell includes a p-type semiconductor layer and an n-type semiconductor layer on the back side of a semiconductor substrate. FIG. 7 shows a back contact solar cell in which a p-type semiconductor layer and an n-type semiconductor layer are provided in a comb shape on the back side. In a solar cell 800, a p-type semiconductor layer 821 and an n-type semiconductor layer 822 which extend in a y direction are provided alternately along an x direction. At one end in the y direction, the n-type semiconductor layer is provided so as to extend in the x direction, and at the other end in the y direction, the p-type semiconductor layer is provided so as to extend in the x direction. Accordingly, a p-type semiconductor layer-formed region and an n-type semiconductor layer-formed region are provided in the shape of interdigitated comb teeth. With this structure, exited photocarriers in the semiconductor substrate by incident light from the light-receiving side can be efficiently collected in each conductive semiconductor layer.

An electrode for extracting collected carriers to outside is provided on each of the n-type semiconductor layer and the p-type semiconductor layer. Electrodes 841 and 842 extending in the y direction are each referred to as a finger electrode. Electrodes 846 and 847 extending in the x direction are each referred to as a bus bar electrode, and connect the end parts of a plurality of finger electrodes. Back contact solar cells in which a semiconductor layer and an electrode thereon are disposed in comb shape are connected in series, thus modularized. As shown by dashed lines in FIG. 7, wiring members 851 and 852 are mounted to bus bar electrodes 846 and 847, respectively, thereby an electrode on a p-type semiconductor layer of one solar cell and an electrode on an n-type semiconductor layer of an adjacent solar cell are connected through the wiring member.

An electrode having a comb shape structure as described above has a large carrier collection loss caused by series resistance because a distance K (carrier collection distance) between an end of a finger electrode and a bus bar electrode is substantially equal to a length Ly of one side of a semiconductor substrate. As the size of the substrate increases, the carrier collection distance increases, and therefore the loss tends to increase.

The series resistance can be reduced by increasing the cross-sectional area of the finger electrode. However, for spacing apart adjacent electrodes from each other, the width of the electrode in the x direction should be made smaller than the width of the semiconductor layer. When the width of the semiconductor layer is increased, the transport distance of photocarriers generated in the semiconductor substrate increases, and therefore a loss caused by carrier recombination increases. When the height of the electrode is increased, stress at the interface between the electrode and the semiconductor layer increases, leading to occurrence of warpage of the cell, and electrode delamination, and so on. Thus, there is a limit to reduction of series resistance by increasing the cross-sectional area of the finger electrode.

Patent Document 2 etc. suggests using a wiring sheet for connection of finger electrodes and connection of adjacent cells. For example, a solar cell 900 shown in FIG. 8 includes only finger electrodes 941 and 942 extending in a y direction, and does not include a bus bar electrode that couples the finger electrodes. A wiring sheet 950 includes finger electrode sections 951 and 952 substantially identical in shape to the finger electrodes 941 and 942 of the cell and bus bar electrode sections 956 and 957 connecting the finger electrodes to each other on a surface of a base material 960 which faces the cell. In modularization, a wiring sheet 950 is disposed on the cell 900, and the finger electrode of the cell and the finger electrode of the wiring sheet are connected to each other as shown in FIG. 9. Accordingly, carriers of all the finger electrodes can be collected through the bus bar sections of the wiring sheet. By increasing the heights of the finger electrodes 951 and 952 of the wiring sheet 950, series resistance can be reduced without increasing the heights of the finger electrodes 941 and 942 of the cell 900.

PRIOR ART DOCUMENTS

Patent Documents

Patent Document 1: Japanese Patent Laid-open Publication No. 2009-200267

Patent Document 2: Japanese Patent Laid-open Publication No. 2010-092981

SUMMARY OF THE INVENTION

Problems to be Solved by the Invention

When finger electrodes are connected using a wiring sheet, it is necessary to correctly align the wiring sheet with a cell. The finger electrode has a small width in an x direction, and therefore if the wiring sheet is positionally displaced in the x direction, or the arrangement angle of the wiring sheet is not arcuate, a short-circuit occurs between an n-side finger electrode provided on an n-type semiconductor layer and a p-side finger electrode provided on a p-type semiconductor layer through the finger electrodes of the wiring sheet, so that cell performance is considerably deteriorated.

Patent Document 2 suggests that by providing finger electrodes of a cell or a wiring sheet with recesses or projections for positioning, positional displacement between a cell and a wiring sheet can be prevented, but even in this case, high alignment accuracy is required. Further, there is the problem that since a margin for providing recesses or projections for positioning is required, the width of the electrode of the cell decreases, leading to deterioration of carrier collection efficiency.

In view of the above-mentioned situations, an object of the present invention is to provide a back contact solar cell which is easily aligned during mount of wiring member on an electrode of the solar cell and which has a reduced carrier collection loss resulting from series resistance of electrodes.

Means for Solving the Problems

A solar cell of the present invention includes a semiconductor substrate, a first conductivity-type layer and a second conductivity-type layer each provided on a back surface of the semiconductor substrate, a first electrode provided on the first conductivity-type layer, and a second electrode provided on the second conductivity-type layer. The solar cell of the present invention is a back contact solar cell, in which no electrode is provided on a light-receiving surface of the semiconductor substrate.

The first electrode and the second electrode are spaced apart from each other, and the first electrode has a plurality of regions isolated from one another by the second electrode disposed therebetween. Each of a plurality of regions of the first electrode has a non-mounting electrode section and a wiring-mounting electrode section. The wiring-mounting electrode section has an electrode height larger than the electrode height of the non-mounting electrode section. An imaginary line connecting the top of the wiring-mounting electrode section in one of two adjacent regions among a plurality of regions of the first electrode and the top of the wiring-mounting electrode section in the other region does not cross the second electrode disposed between the two regions.

When the second electrode has a plurality of regions isolated by the first electrode disposed therebetween, each of a plurality of regions of the second electrode may have a wiring-mounting electrode section having an electrode height larger than the electrode height of the non-mounting electrode section. Preferably, an imaginary line connecting between the tops of wiring-mounting electrode sections in two adjacent regions of the second electrode does not cross the first electrode disposed between the two regions.

When each of a plurality of regions of the first electrode and/or the second electrode has a plurality of wiring-mounting electrode sections, it suffices that an imaginary line connecting between the tops of the closest wiring-mounting electrode sections between two adjacent regions does not cross the electrode disposed between the two regions. The height-direction distance between an imaginary line connecting the tops of wiring-mounting electrode sections in two adjacent regions and the top of the electrode disposed between the two regions is preferably 1 μm or more.

In one embodiment, the first electrode and the second electrode extend in parallel, and are arranged alternately along a direction perpendicular to the extending direction. In this embodiment, it is preferable that wiring-mounting electrode sections provided in a plurality of regions of the first electrode are arranged side by side in a direction perpendicular to the electrode extending direction. When a wiring-mounting electrode section is provided in each of a plurality of regions of the second electrode, it is preferable that the wiring-mounting electrode sections of the second electrode are arranged side by side in a direction perpendicular to the he electrode extending direction.

The present invention also relates to a method for testing the solar cell. In the test method of the present invention, I-V measurement is performed by feeding a current through a solar cell while a measurement probe is in detachable contact with a wiring-mounting electrode section of the solar cell.

The present invention also relates to a solar cell module in which a wiring member is electrically mounted on the electrode of the solar cell. Preferably, the wiring member is mounted on a region having a large electrode height, i.e., a wiring-mounting electrode section. Whether a solar cell (cell) is a non-defective product or a defective product is determined on the basis of the result of the I-V measurement, and only cells that are determined as non-defective products are connected to a wiring member. Thus, the yield of the solar cell module can be improved.

Effects of the Invention

A wiring member is mounted to a wiring-mounting electrode section of a solar cell, and thus a plurality of first electrodes and a plurality of second electrodes can be electrically connected, respectively without causing a short-circuit between the first electrode and the second electrode. The solar cell has a large allowance for positional displacement and angular displacement when the wiring member is mounted to the wiring-mounting electrode section, and therefore modularization of the solar cell is facilitated to contribute to improvement of the yield. The photocarrier transport distance in the electrode decreases, and therefore a carrier collection loss caused by series resistance of the electrode can be reduced to improve the conversion characteristics (particularly the fill factor) of the solar cell.

MODE FOR CARRYING OUT THE INVENTION

Figure 1:
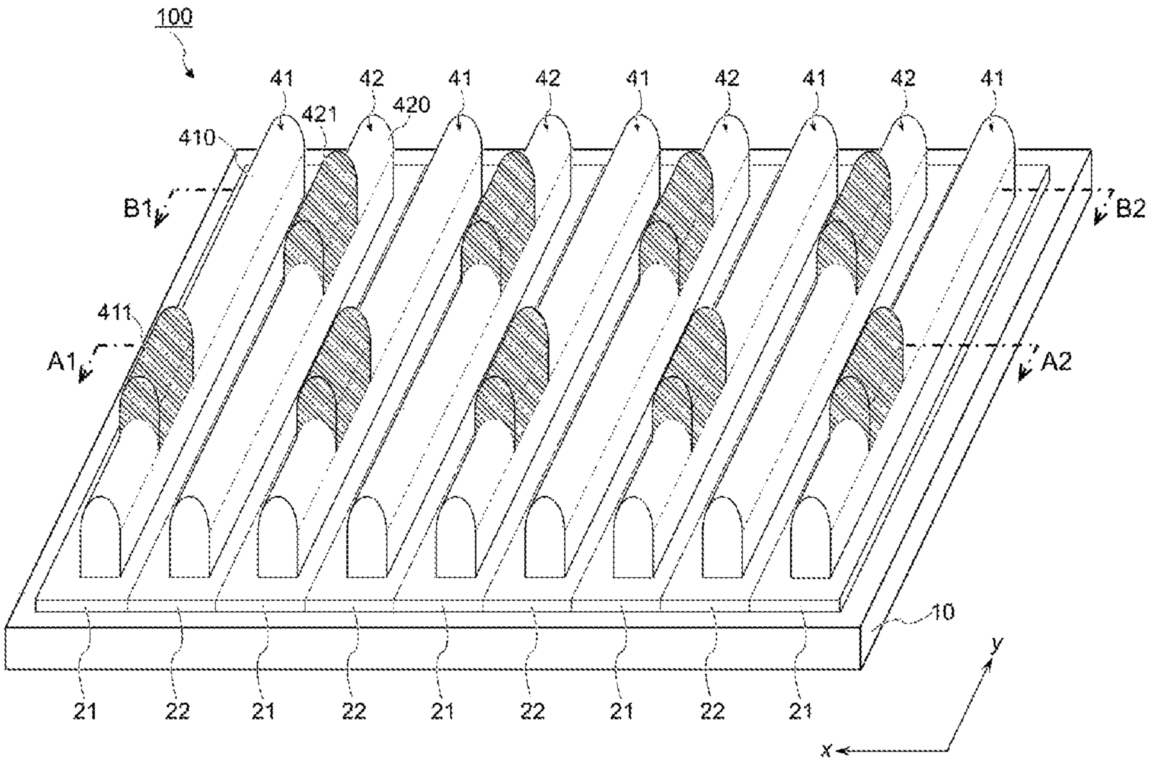
FIG. 1 is a schematic perspective view of a back contact solar cell according to one embodiment of the present invention.
Figure 2:
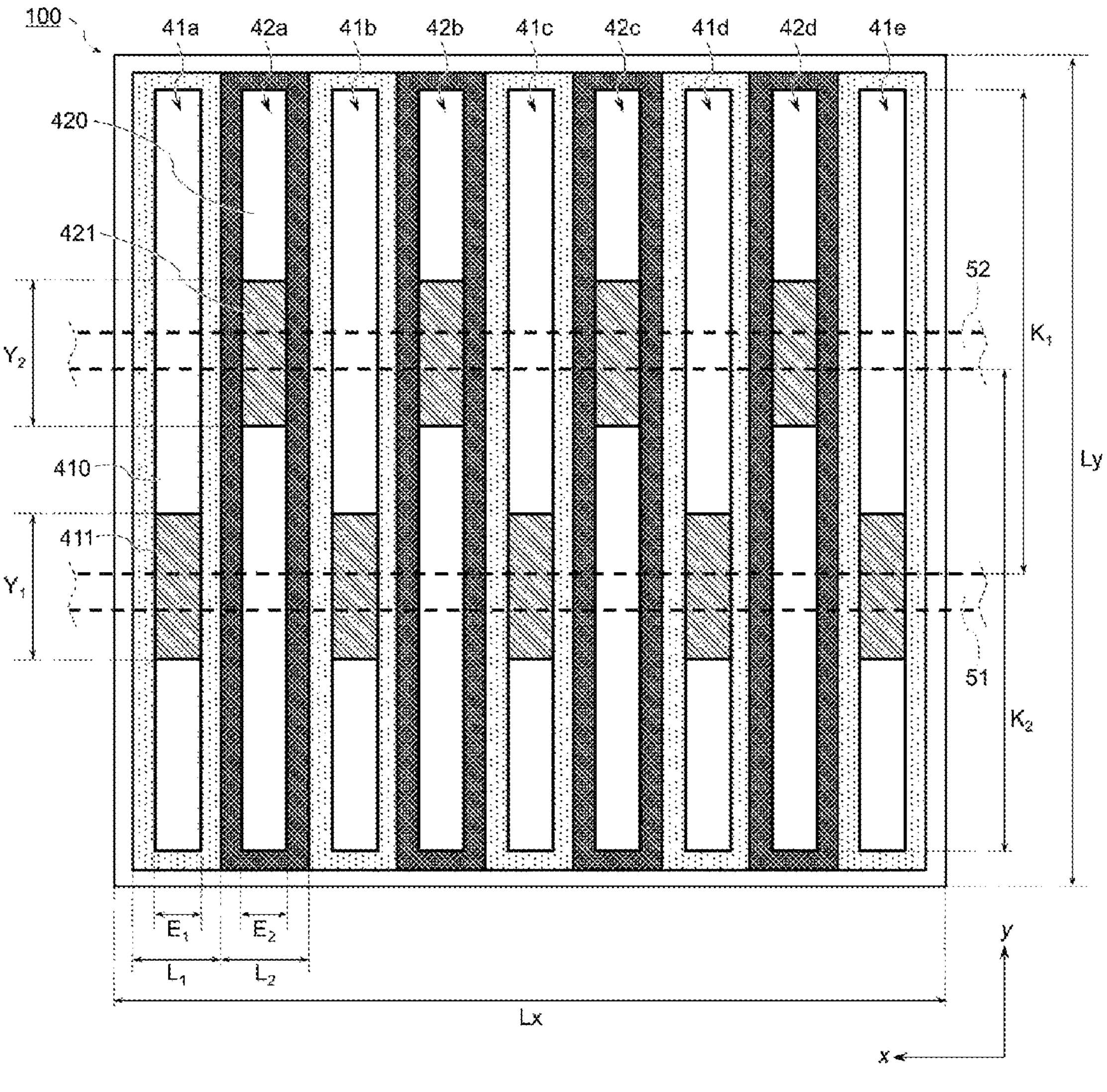
FIG. 2 is a plan view of the solar cell in FIG. 1 which is seen from the back surface (electrode-formed surface) side.
Figure 3A:
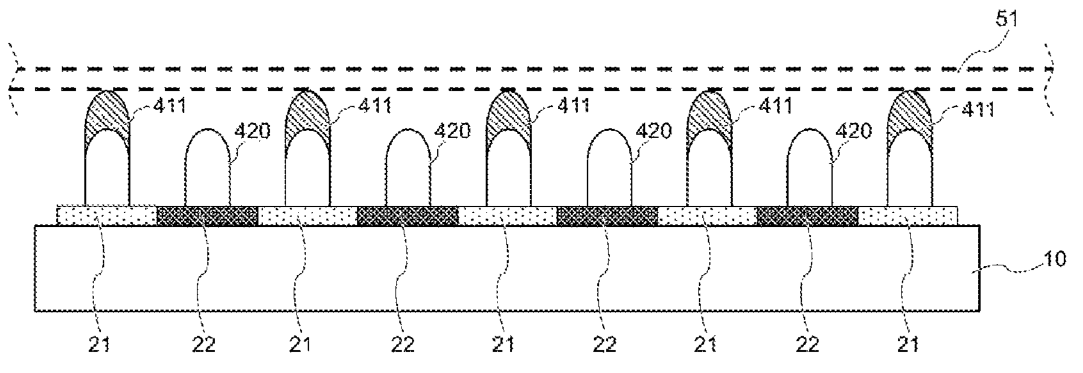
FIG. 3A is a sectional view taken along line A1-A2 in FIG. 1.
Figure 3B:
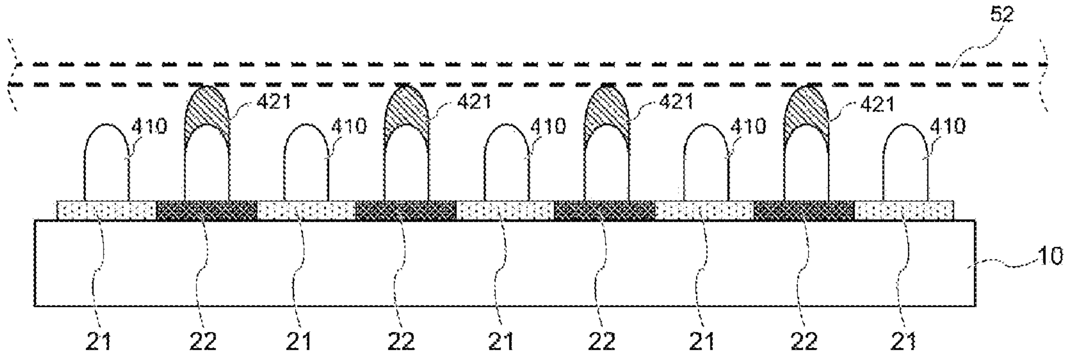
FIG. 3B is a sectional view taken along line B1-B2 in FIG. 1.

FIG. 1 is a schematic perspective view of a back contact solar cell according to one embodiment of the present invention. FIG. 2 is a plan view of the upper side of the solar cell in FIG. 1 (back side of the solar cell). FIG. 3A is a sectional view taken along line A1-A2 in FIG. 1, and FIG. 3B is a sectional view taken along line B1-B2 in FIG. 1. In FIGS. 2, 3A and 3B, a state in which wiring members 51 and 52 are mounted onto the electrode of the solar cell is shown by a dashed line.

A solar cell 100 includes a first conductivity-type layer 21 and a second conductivity-type layer 22 on a back surface of a semiconductor substrate 10 (surface on the upper side in FIG. 1). A first electrode 41 is provided on the first conductivity-type layer 21, and a second electrode 42 is provided on the second conductivity-type layer 22. The first electrode 41 and the second electrode 42 are spaced apart and insulated from each other.

As the semiconductor substrate 10, a crystalline semiconductor substrate such as a crystalline silicon substrate is used. The crystalline silicon substrate may be either of a single-crystalline silicon substrate and a polycrystalline silicon substrate. The conductivity-type of the crystalline semiconductor substrate may be either an n-type or a p-type. Preferably, the semiconductor substrate 10 has a texture (irregularity structure) provided on the light-receiving side, from the viewpoint of optical confinement. The back surface of the semiconductor substrate may also be provided with a texture.

The first conductivity-type layer 21 and the second conductivity-type layer 22 are semiconductor layers having different conductivity-types. One of the semiconductor layers is a p-type semiconductor layer, and the other is an n-type semiconductor layer. In the back contact solar cell, light is incident from the light-receiving side, and photocarriers produced in the semiconductor substrate are collected on the back surface. Thus, both the p-type semiconductor layer and the n-type semiconductor layer are provided on the back surface of the semiconductor substrate, and an electrode is provided on each of the semiconductor layers. The light-receiving surface of the semiconductor substrate 10 is not provided with an electrode.

The first conductivity-type layer 21 and the second conductivity-type layer 22 are each provided in a band shape extending in a first direction (y direction). The first conductivity-type layer and the second conductivity-type layer are alternately arranged along a second direction (x direction) perpendicular to the first direction. Although the width $L_1$ of the first conductivity-type layer and the width $L_2$ of the second conductivity-type layer are not particularly limited, they are each preferably in a range of 50 to 3000 μm. Unless otherwise specified, the width of each of the conductive layer and the electrode is a width in a direction perpendicular to the extending direction, i.e., in the x direction in FIG. 2.

Preferably, the first conductivity-type layer 21 and the second conductivity-type layer 22 are not in contact with each other. For preventing contact of the first conductivity-type layer and the second conductivity-type layer, an insulating layer (not illustrated) may be provided between both the layers.

Each of the first conductivity-type layer 21 and the second conductivity-type layer 22 is, for example, a silicon-based thin-film of amorphous silicon, crystalline silicon or the like which is formed by chemical vapor deposition (CVD). The conductive layer may be a doping layer provided on a surface of the silicon substrate by thermal diffusion, laser doping or the like. The method for patterning the first conductivity-type layer and the second conductivity-type layer in a predetermined shape is not particularly limited, and examples thereof include a method in which a silicon-based thin-film is formed using a mask, and a method in which a semiconductor layer etc. under a resist opening is removed using an etchant or an etching paste while the surface is covered with a resist or the like.

The first electrode 41 extending in the y direction is provided on the first conductivity-type layer 21, and the second electrode 42 extending in the y direction is provided on the second conductivity-type layer 22. The first electrode 41 and the second electrode 42 are spaced apart from each other, and alternately arranged along the x direction.

Preferably, the width $E_1$ of the first electrode 41 is smaller than the width $L_1$ of the first conductivity-type layer 21, and the width $E_2$ of the second electrode 42 is smaller than the width $L_2$ of the second conductivity-type layer 22. When an insulating layer and other layer are provided at a boundary section between the first conductivity-type layer 21 and the second conductivity-type layer 22, the width of the electrode may be larger than the width of the semiconductor layer as long as the first electrode and the second electrode are spaced apart from each other. For efficiently extracting carriers collected in the semiconductor layer, the width of the electrode is preferably as large as possible. Thus, the width $E_1$ of the first electrode 41 is preferably more than 0.5 times, more preferably more than 0.7 times of the width $L_1$ of the first conductivity-type layer 21. Similarly, the width $E_2$ of the second electrode 42 is preferably more than 0.5 times, more preferably more than 0.7 times of the width $L_2$ of the second conductivity-type layer 22.

The first electrode 41 and the second electrode 42 each include a metal layer. The metal layer may have a multilayer structure. The metal layer that forms the electrode can be formed by a known method such as printing or plating, and an Ag electrode formed by screen printing with an Ag paste, a copper plating electrode formed by electroplating, or the like is preferably used. The first electrode and the second electrode may include a transparent electrode layer in addition to the metal layer. As the transparent electrode layer, for example, a thin-film composed of a transparent conductive metal oxide such as indium oxide, tin oxide, zinc oxide, titanium oxide or a composite oxide thereof is used. In particular, an indium-based composite oxide mainly composed of indium oxide is preferable.

Since the first electrode 41 and the second electrode 42 are alternately arranged along the x direction, the first electrode 41 and the second electrode 42 each have a plurality of regions. The first electrode 41 has a plurality of regions (a plurality of finger electrodes, each electrode may also be referred to as "first electrode") 41_a_ to 41_e_ isolated from one another by the second electrode 42 disposed therebetween. The second electrode 42 has a plurality of regions (a plurality of finger electrodes, each electrode may also be referred to as "second electrode") 42_a_ to 42_d_ isolated from one another by the first electrode 41 disposed therebetween (see FIG. 2). For example, the second finger electrode 42_a_ is disposed between the first finger electrodes 41_a_ and 41_b_, and therefore the first finger electrodes 41_a_ and 41_b_ can be considered as two regions isolated from each other by the second finger electrode 42_a_ disposed therebetween. Similarly, the first finger electrode 41_b_ is disposed between the second finger electrodes 42_a_ and 42_b_, and therefore the second finger electrodes 42_a_ and 42_b_ can be considered as two regions isolated from each other by the first finger electrode 41_b_ disposed therebetween.

Although five first finger electrodes 41_a_ to 41_e_ are provided so as to be spaced apart from one another in the embodiment shown in FIG. 2, a plurality of first finger electrodes may be connected to one another through a bus bar electrode. A plurality of second finger electrodes may be connected to one another through a bus bar electrode (see FIG. 12).

Each of the first finger electrodes 41*a* to 41*e* has a non-mounting electrode section 410 and a wiring-mounting electrode section 411. The wiring-mounting electrode section 411 has an electrode height larger than the electrode height of the non-mounting electrode section 410. Each of the second finger electrodes 42*a* to 42*d* has a non-mounting electrode section 420 and a wiring-mounting electrode section 421 having an electrode height larger than the electrode height of the non-mounting electrode section. The electrode height $H_1$ of each of the wiring-mounting electrode sections 411 and 421 is preferably larger than by 1 μm or more than the electrode height $H_0$ of each of the non-mounting electrode sections 410 and 420. The value of $H_1$-$H_0$ is preferably 1 to 150 μm, more preferably 5 to 80 μm.

The method for providing a wiring-mounting electrode section having a larger electrode height as compared to the height in the surrounding is not particularly limited. For example, a wiring-mounting electrode section having a large electrode height can be formed by printing or plating a predetermined region after forming an electrode having a uniform height. The material of a bulky part (hatched part in FIG. 1) of the wiring-mounting electrode section may be identical to or different from the material of other region of the electrode.

By providing a height difference in finger electrodes, electrical connection of the finger electrodes through the wiring member is facilitated. The electrode height is a distance between the substrate surface and the top of the electrode. When there exists a region where the substrate has a reduced thickness on a partial basis due to, for example, etching for formation of a semiconductor layer, the distance between a reference plane and the top of the electrode may be defined as an electrode height, the reference plane being parallel to the substrate surface.

When the overall height of finger electrodes is increased, series resistance can be reduced because the cross-sectional area of the electrode increases. However, when the electrode height is increased, stress at the interface between the semiconductor layer and the electrode may increase, leading to occurrence of electrode delamination. In the back contact solar cell, only one surface is provided with an electrode, and therefore when the electrode height increases, stresses on front and back sides of the substrate are unbalanced, so that deformation such as warpage of the cell easily occurs, leading to breakage of the cell. If the cell is deformed due to stress at the electrode interface, defects such as positional displacement and a short-circuit may occur in modularization. Thus, the electrode height $H_0$ of the non-mounting electrode section is preferably 100 μm or less, more preferably 60 μm or less, further preferably 30 μm or less.

In the solar cell of the present invention, the carrier collection distance in finger electrodes can be reduced by mounting the wiring member to the wiring-mounting electrode section as described in detail later. Accordingly, series resistance of finger electrodes can be reduced, and therefore it is not necessary to excessively increase the electrode height. Unlike the case where the overall height of finger electrodes is increased, stress at the electrode interface is relaxed by regions having a small electrode height (non-mounting electrode sections 410 and 420) even if regions having a large electrode height (wiring-mounting electrode sections 411 and 421) exist on a local basis. Thus, electrode delamination, deformation/breakage of the cell, and the like hardly occur.

In each of the first finger electrodes 41*a* to 41*e*, the wiring-mounting electrode section 411 is provided in the same y coordinate region. In each of the second finger electrodes 42*a* to 42*d*, the wiring-mounting electrode section 421 is provided in the same y coordinate region. Thus, when the wiring-mounting electrode sections are linearly arranged, solar cells can be modularized by mounting a first wiring member 51 to the wiring-mounting electrode section 411 of the finger electrode, and mounting a second wiring member 52 to the wiring-mounting electrode section 421 of the second finger electrode. Preferably, the wiring-mounting electrode sections of a plurality of finger electrodes are linearly arranged in a direction perpendicular to the extending direction of the finger electrodes. Although the width of the wiring member is not particularly limited, it is preferably about 0.3 mm or more.

The non-mounting electrode sections 420 of the second finger electrodes 42*a* to 42*d* each exist in the y coordinate region where the wiring-mounting electrode section 411 of the first finger electrode is provided. The non-mounting electrode section 420 of the second finger electrode has an electrode height larger than the electrode height of the wiring-mounting electrode section 411 of the first finger electrode. Thus, as shown in FIG. 3A, when the first wiring member 51 is disposed so as to extend in the x direction within the y coordinate region where the wiring-mounting electrode section 411 of the first electrode is provided, the wiring member can be provided to connect the tops of the wiring-mounting electrode sections 411 of the first finger electrodes 41*a* to 41*e*. Accordingly, the first wiring member 51 is not in contact with the non-mounting electrode sections 420 of the second finger electrodes 42*a* to 42*d*, and a plurality of first finger electrodes 41*a* to 41*e* can be selectively electrically connected through the first wiring member 51.

The non-mounting electrode sections 410 of the first finger electrodes 41*a* to 41*e* each exist in the y coordinate region where the wiring-mounting electrode section 421 of the second finger electrode is provided. The non-mounting electrode section has an electrode height smaller than the electrode height of the wiring-mounting electrode section. Thus, as shown in FIG. 3B, when the second wiring member 52 is disposed so as to connect the tops of the wiring-mounting electrode sections 421 of the second finger electrodes 42*a* to 42*d*, a plurality of second finger electrodes 42*a* to 42*d* can be selectively electrically connected.

Figure 4:
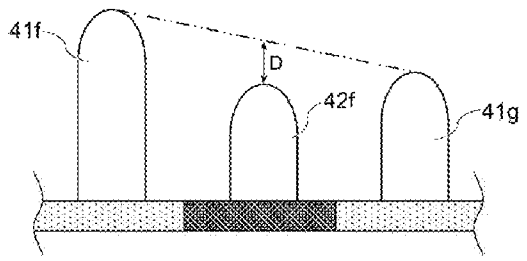
FIG. 4 is a sectional view for explaining an electrode height.

For preventing the first wiring member 51 and the second finger electrode from coming into contact with each other, it suffices that the electrode height in the wiring-mounting electrode section 411 of the first finger electrode is larger than the electrode height in the non-mounting electrode section of the second finger electrode. Process-dependent variation may occur, although the electrode height in the wiring-mounting electrode section is preferably uniform. Even when the electrode height is not uniform, it suffices that as shown in FIG. 4, an imaginary line connecting the tops of the wiring-mounting electrode sections of two adjacent first finger electrodes (two first finger electrodes adjacent to one second finger electrode) 41*f* and 41*g* does not cross the second finger electrode 42*f* disposed therebetween. In other words, it suffices that when a straight line is drawn between the tops of adjacent first finger electrodes, the height of the drawn straight line is larger than the height of the second finger electrode existing between the first finger electrodes. The height-direction distance D between an imaginary line connecting the tops of two first finger electrodes 41$f$ and 41$g$ and the top of the second finger electrode 42$f$ disposed therebetween is preferably 1 μm or more, more preferably 5 μm or more.

Similarly, for preventing the second wiring member 52 and the first finger electrode from coming into contact with each other, it suffices that an imaginary line connecting the tops of the wiring-mounting electrode sections of two adjacent second finger electrodes does not cross the first finger electrode 41 disposed between the second finger electrodes. The height-direction distance between an imaginary line connecting the tops of two second finger electrodes and the top of the first finger electrode disposed therebetween is preferably 1 μm or more, more preferably 5 μm or more.

Thus, the distance (carrier collection distance) over which carriers collected in a semiconductor layer move across the finger electrodes until reaching the wiring member decreases, when finger electrodes are each provided with a non-mounting electrode section having a relatively small electrode height and a wiring-mounting electrode section having a larger electrode height than the non-mounting electrode section, and the wiring-mounting electrode sections of the plurality of finger electrodes are connected through a wiring material. For example, in FIG. 2, the maximum value of the carrier collection distance of the first finger electrode 41 (transport distance of carriers collected in the wiring member from the farthest part) is $K_1$, and the maximum value of the carrier collection distance of the second finger electrode 42 is $K_2$. The carrier collection distance can be adjusted by the positions of the wiring-mounting electrode sections 411 and 421 in the extending direction (y direction) of the finger electrodes 41 and 42. For example, when the wiring-mounting electrode section exists near the center of the finger electrode in the extending direction, the carrier collection distance is about half the length of the finger electrode.

The resistance R of the electrode is expressed by $R=\rho K/S$ where ρ is a volume resistivity of the electrode material, K is a carrier collection distance, and S is a cross-sectional area of the electrode. When the carrier collection distance is reduced by half, the resistance is also reduced by half. Thus, by providing a wiring-mounting electrode section near the center of the finger electrode in the extending direction to decrease the maximum value of the carrier collection distance, an electrical loss caused by resistance of the electrode can be reduced to improve conversion characteristics (particularly the fill factor) of the solar cell.

Figure 5:
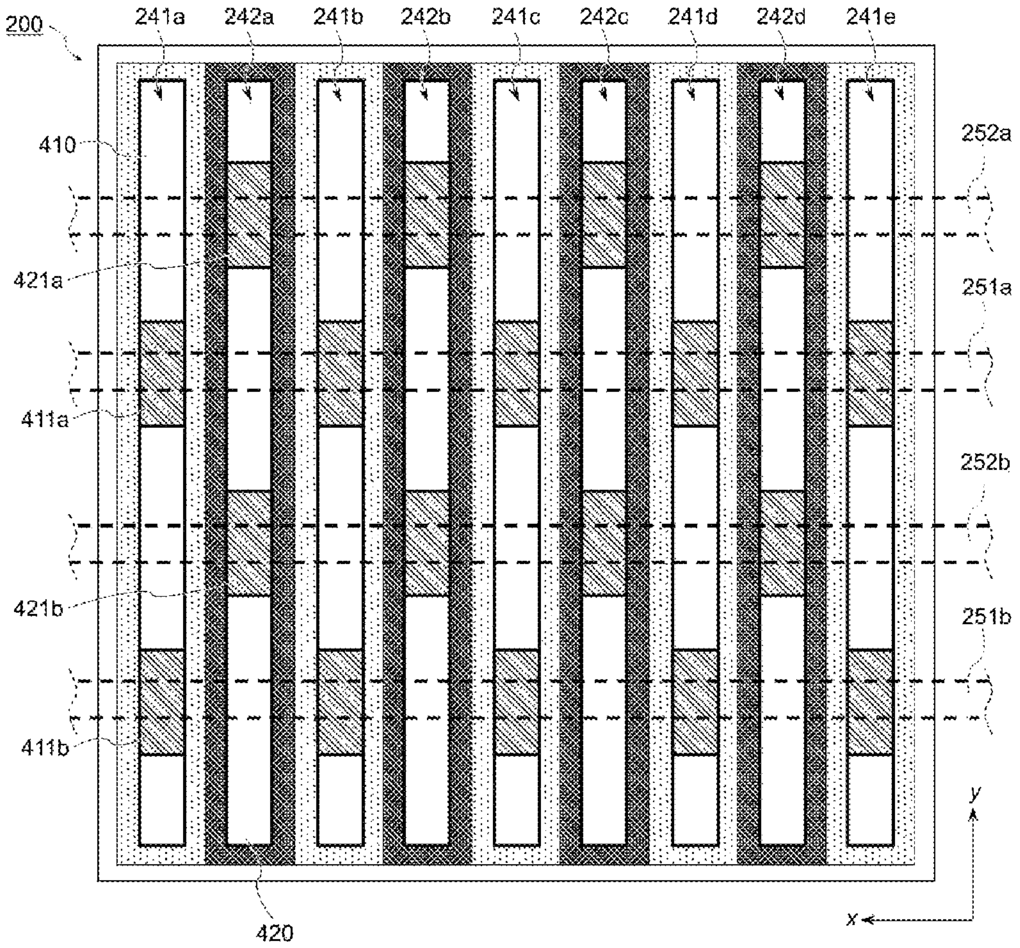
FIG. 5 is a plan view of a solar cell of one embodiment.

Although a mode in which one finger electrode is provided with one wiring-mounting electrode section is shown in FIG. 2, one finger electrode may be provided with a plurality of wiring-mounting electrode sections. For example, in a solar cell 200 shown in FIG. 5, each of first finger electrodes 241$a$ to 241$e$ has wiring-mounting electrode sections 411$a$ and 411$b$ at two positions in the y direction, and each of second finger electrodes 242$a$ to 242$d$ has wiring-mounting electrode sections 421$a$ and 421$b$ at two positions in the y direction. Thus, by providing a plurality of wiring-mounting electrode sections in the extending direction of the finger electrode, the carrier collection distance of the finger electrode can be further decreased to reduce an electrical loss caused by resistance of the electrode.

When one first finger electrode 241 is provided with a plurality of wiring-mounting electrode sections 411$a$ and 411$b$, it suffices that an imaginary line connecting the tops of the closest wiring-mounting electrode sections of two adjacent finger electrodes does not cross the second finger electrode disposed between the first finger electrodes. For example, when two first finger electrodes 241$a$ and 241$b$ are connected to each other through a first wiring member 251$a$, wiring-mounting electrode sections 411$a$ provided in the same y coordinate region are the closest wiring-mounting electrode sections. It suffices that an imaginary line connecting the tops of the above-mentioned wiring-mounting electrode sections does not cross the second finger electrode 242$a$. When one second finger electrode 242 is provided with a plurality of wiring-mounting electrode sections 421$a$ and 421$b$, it suffices that an imaginary line connecting the tops of the closest wiring-mounting electrode sections of two adjacent finger electrodes does not cross the first finger electrode disposed between the second finger electrodes.

When one finger electrode is provided with a plurality of wiring-mounting electrode sections, there is the advantage that a loss caused by a connection failure between the wiring member and the wiring-mounting electrode section can be reduced in addition to reduction of an electrical loss caused by reduction of the carrier collection distance of the finger electrode. Although the electrode height in the wiring-mounting electrode section is preferably uniform, as described above, it may be unable of a specific finger electrode due to process-dependent variation etc. When the number of mounting parts of one finger electrode to the wiring member is only one and the mount of the wiring member on a wiring-mounting electrode section is inappropriate, carriers of a finger electrode in which a connection failure with the wiring member occurs cannot be extracted to outside, and this leads to a complete loss.

On the other hand, when one finger electrode is provided with a plurality of wiring-mounting electrode sections each connected to a wiring member, carriers can be extracted to outside through a connection part where a wiring-mounting electrode section is connected to the wiring member, even if a connection failure with the wiring member occurs in one wiring-mounting electrode section. In this case, occurrence of a complete carrier collection loss can be avoided, although the carrier collection distance increases due to a contact failure with the wiring member. Thus, a considerable electrical loss caused by a contact failure can be avoided.

Figure 6:
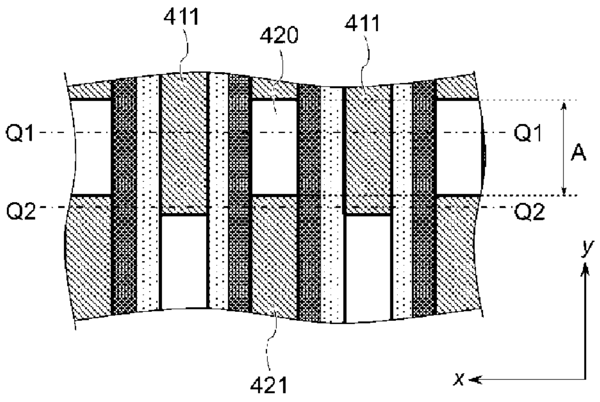
FIG. 6 is a plan view showing a state in which wiring-mounting electrode sections of a first electrode and a second electrode overlap each other in first direction.
Figure 7:
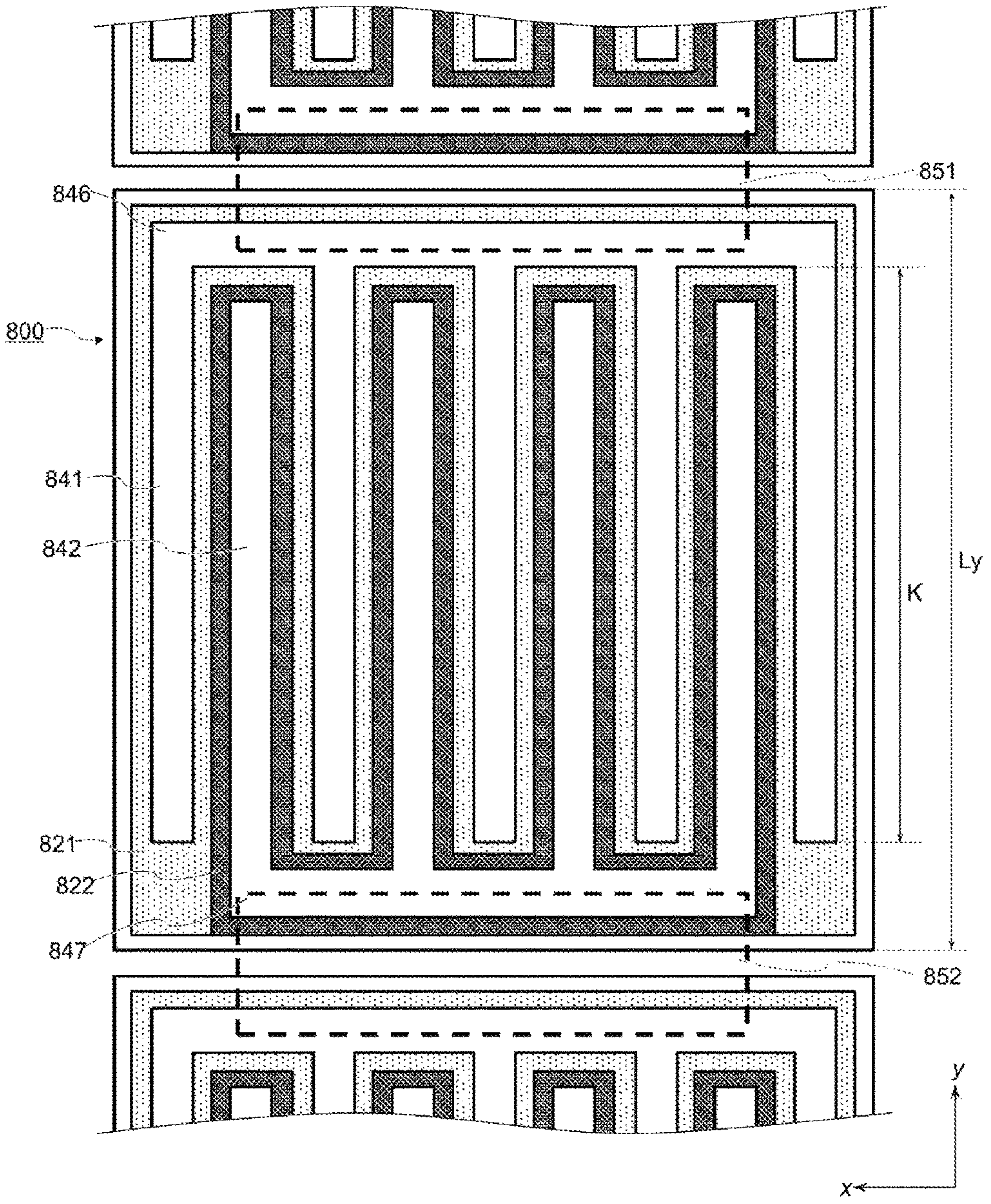
FIG. 7 is a plan view of a solar cell and a solar cell module in a conventional technique.

When a large number of wiring-mounting electrode sections are provided in the extending direction of the finger electrode, or wiring-mounting electrode sections have large lengths $Y_1$ and $Y_2$, the wiring-mounting electrode section 421 of the second finger electrode may exist between the wiring-mounting electrode sections 411 of two adjacent first finger electrodes as shown by line Q2-Q2 in FIG. 6. Even in this case, it suffices that the non-mounting electrode section 420 of the second finger electrode exists between the wiring-mounting electrode sections 411 of two adjacent first finger electrodes as shown by line Q1-Q1. It suffices in this case that the length A of the non-mounting electrode section 420 is larger than the width of the wiring member. For reliably preventing a short-circuit between the first finger electrode and the second finger electrode which is caused by the wiring member, it is preferable that the wiring-mounting electrode section 411 of the first finger electrode and the wiring-mounting electrode section 421 of the second finger electrode do not overlap each other in the extending direction (x direction) of the wiring member.

The method for mounting a wiring member on the electrode is not particularly limited as long as wiring-mounting electrode sections of finger electrodes can be connected. When the first electrode and the second electrode each extending in the y direction are arranged alternately along the x direction, it is preferable that the wiring-mounting electrode sections of first finger electrodes are provided in the same y coordinate region, the first wiring member 51 is disposed so as to extend in the x direction, and the wiring member is mounted to the wiring-mounting electrode section as shown in FIG. 2. This is because connection of adjacent solar cells is facilitated.

When the first finger electrode and the second finger electrode each extending in the first direction (y direction) are arranged alternately in the second direction (x direction) perpendicular to the first direction, the extending direction of the wiring member is preferably parallel to the second direction. Specifically, the angle formed by the extending direction of the wiring member and the second direction is preferably 5° or less, more preferably 3° or less, further preferably 1° or less.

The angle formed by the extending direction of the wiring member and the second direction is ideally 0°. Making the arrangement angle of the wiring member always constant with high accuracy is not easy, and may cause complication of processes and reduction of the yield. Mounting the wiring member on the wiring-mounting electrode section of the finger electrode has the advantage that alignment is easier and the allowable range of the arrangement angle of the wiring member is wider as compared to connection of the finger electrode using a wiring sheet.

When a finger electrode of the cell is electrically connected by a wiring sheet, the allowable angular displacement range is $\tan^{-1}(X/Y)$ where Y is an electrode length, and X is an allowance for positional displacement in the electrode width direction (x direction). For example, when a 150 mm-long finger electrode provided on a 6-inch substrate (length of one side: about 156 mm) is laminated to a wiring sheet with a positional displacement allowance X=±0.5 mm, the allowable range for angular displacement is 0.38° (±0.19°), and thus extremely high accuracy is required. As described above, the width of the finger electrode is restricted by the width of the semiconductor layer. When the width of the semiconductor layer is increased for increasing the width of the finger electrode, the photocarrier transport distance in the semiconductor substrate increases, leading to an increase in loss caused by carrier recombination. Thus, it is difficult to increase the allowance for positional displacement of the wiring sheet while maintaining conversion characteristics.

When the wiring member 51 is mounted to the wiring-mounting electrode sections 411 of a plurality of finger electrodes, the allowable angular displacement range is $\pm\tan^{-1}(Y_1/L)$ where $Y_1$ is a length of the wiring-mounting electrode section 411 in the extending direction (y direction) of the first finger electrode, and L is a length of the semiconductor substrate in the connecting direction (x direction) of the wiring member 51. The length $Y_1$ of the wiring-mounting electrode section is not subjected to such a restriction that is placed on the electrode width, and therefore by increasing the length $Y_1$, the allowable range for displacement of the arrangement angle of the wiring member can be made wide while conversion characteristics are maintained. For example, when a 6-inch substrate (L=156 mm) is used, the allowable positional displacement range is ±2.9° given that the length $Y_1$ of the wiring-mounting electrode section is 8 mm.

Thus, in the solar cell of the present invention, an electrical loss caused by resistance of the electrode can be reduced by decreasing the carrier collection distance. Because of a wide allowable range for alignment (arrangement angle) in mounting the wiring member to the electrode, the module production process can be simplified, and the yield can be improved.

Figure 8:
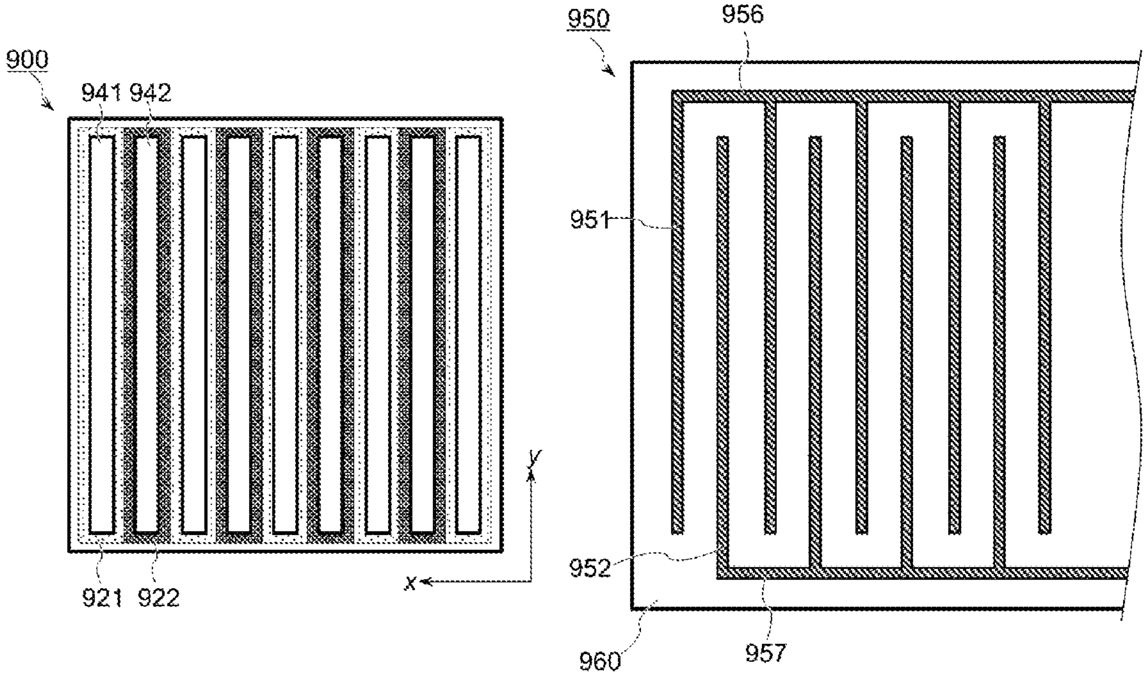
FIG. 8 is a plan view of a wiring sheet, and a solar cell with an electrode to be connected by the wiring sheet.
Figure 9:
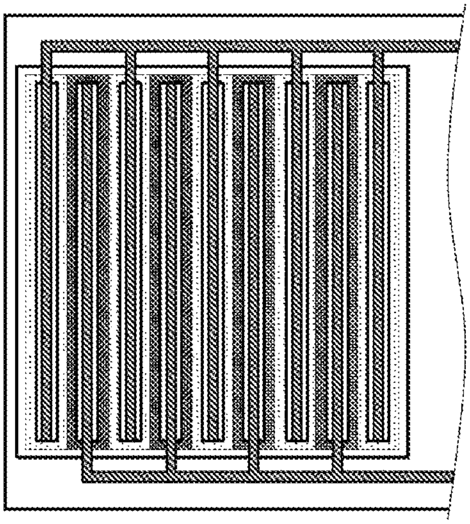
FIG. 9 is a plan view showing a state in which the solar cell and the wiring sheet in FIG. 8 are connected to each other.

A solar cell 900 shown in FIG. 8 has no bus bar electrode and provided with a plurality of finger electrodes spaced apart from one another. For a solar cell shown in FIG. 8 or the like, it is difficult to align a wiring sheet 950 with the solar cell, and also difficult to measure performance as a single cell before the cell is laminated to the wiring sheet. For measuring the characteristics of a back contact solar cell having no bus bar electrode, it is necessary to electrically connect finger electrodes, and as described above, it is necessary to align the solar cell with a wiring sheet with high accuracy for electrical connection of finger electrodes. Although is possible to measure performance by bringing a probe into contact with each finger electrode without using a wiring sheet, high alignment accuracy is required as well in this case.

The back contact solar cell is a solar cell which is expensive while having high performance. Thus, it is required to minimize occurrence of defective products by monitoring performance of cells all times in a production process ranging from preparation of cells to modularization, and immediately giving a feedback to a production line if the performance varies. Inability to determine whether a cell is non-defective or defective until a plurality of cells are connected to prepare a module may pose a major problem in terms of a yield and a production cost.

Figure 10:
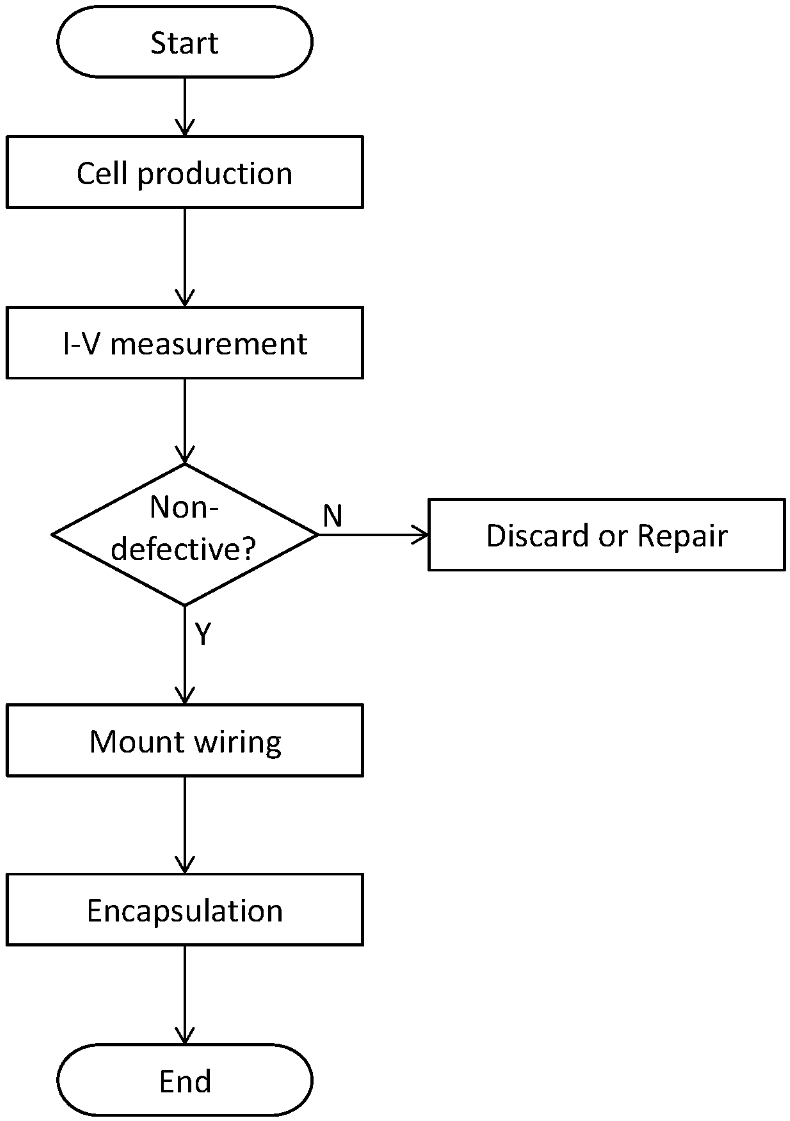
FIG. 10 is a flow chart of one example of a process for producing a solar cell module.

In the solar cell of the present invention, it is easy to connect a finger electrode and a probe to each other, and therefore even when the solar cell does not have a bus bar electrode that couples a plurality of finger electrodes, the I-V characteristics of the cell in the production process can be easily measured. FIG. 10 is a flow chart showing one example of a process for producing a solar cell module of the present invention.

First, a cell (solar cell) is prepared. Hereinafter, preparation of the cell will be described with a heterojunction type crystalline silicon solar cell as an example. The solar cell of the present invention is not limited to a heterojunction solar cell.

As a semiconductor substrate, a conductive single-crystalline silicon substrate is used. The conductivity-type of the conductive single-crystalline silicon substrate may be either an n-type or a p-type. It is preferable to use an n-type single-crystalline silicon substrate from the viewpoint of the long carrier lifetime in the crystalline substrate. The thickness of the silicon substrate is preferably 50 to 200 μm, more preferably 60 to 180 μm, further preferably 70 to 180 μm. By using a substrate having a thickness in this range, the material cost can be reduced. When a substrate having a small thickness is used, and the thickness of a metal electrode is increased, the cell tends to be warped. As described above, in the present invention, the resistance of the electrode can be reduced even when the thickness of the electrode is not excessively increased, and therefore warpage of the cell can be suppressed even if the substrate has a small thickness.

Preferably, a passivation layer and an anti-reflection film are sequentially formed on the light-receiving side of the silicon substrate. The passivation layer has an effect of terminating surface defects of the substrate to suppress carrier recombination, and an intrinsic silicon layer is preferably used as the passivation layer. The anti-reflection film is preferably a light-transmissive thin-film having a refractive index of about 1.5 to 2.3, and as a material thereof, SiO, SiN, SiON or the like is used. Although the method for forming the anti-reflection film is not particularly limited, a CVD (chemical vapor deposition) method is preferable because the thickness can be precisely controlled.

As a conductive layer to be formed on the back surface of the silicon substrate, a silicon-based thin-film is preferable, and in particular, an amorphous p-type silicon thin-film and n-type silicon thin-film are preferable. As a dopant impurity, P (phosphorus) is preferably used for n-type silicon, and B (boron) is preferably used for p-type silicon. Preferably, an intrinsic silicon thin-film is provided between the silicon substrate and the conductive silicon-based thin-film. By providing an intrinsic silicon thin-film on a surface of the silicon substrate, surface defects of the silicon substrate are terminated to increase the lifetime, so that the power generation of the solar cell can be improved.

Although the method for forming the conductive silicon-based thin-film is not particularly limited, a CVD method is preferable. As a material gas for CVD, a $SiH_4$ gas is preferable, and as a dopant additive gas, hydrogen-diluted $B_2H_6$ or $PH_3$ is preferably used. Impurities such as oxygen and carbon may be added in a very small amount for improving the light transmittance. For example, by introducing gases of $CO_2$, $CH_4$ and the like in CVD deposition, oxygen and carbon can be introduced into the silicon-based thin-film. When an insulating layer is provided at a boundary part between a p-type silicon-based thin-film and an n-type silicon-based thin-film, formation of an insulating layer of silicon oxide etc. by a CVD method can contribute to reduction of the process cost and improvement yield by simplifying the process.

In a heterojunction solar cell, a transparent electrode layer is provided between a conductive semiconductor layer and a metal electrode. As described above, the material of the transparent electrode layer is preferably a conductive oxide such as an indium-based composite oxide. The transparent electrode layer can be formed by a sputtering method, a CVD method or the like. The transparent electrode layer is patterned, like the p-type semiconductor layer and the n-type semiconductor layer.

The metal electrode is provided on the transparent electrode layer. As described above, the metal electrode has a non-mounting electrode section and a wiring-mounting electrode section having an electrode height larger than that of the non-mounting electrode section. Details of the metal electrode are as described above, and description thereof is omitted here.

Figure 11:
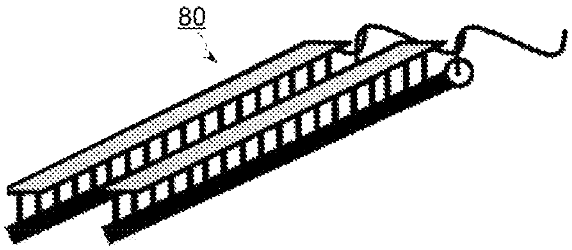
FIG. 11 is a schematic perspective view of a probe to be used in I-V measurement.

After the cell is prepared in the manner described above, I-V measurement is performed. I-V measurement can be performed in the following manner: a detachable measurement probe 80 as shown in FIG. 11 is brought into contact with each of the wiring-mounting electrode sections of a plurality of first electrodes that are spaced apart from one another; and a current is fed through the solar cell. The electrodes spaced apart from one another can be electrically connected by bringing the probe into contact with each of the wiring-mounting electrode sections of a plurality of electrodes with the probe disposed in a direction perpendicular to electrode extending direction. Since the length of the wiring-mounting electrode section is sufficiently larger as compared to the width of the electrode, it is easy to align the probe. The probe can be made to conform to various electrode patterns by appropriately changing the shape of the probe. In the production process, I-V measurement of the cell can be quickly performed by using a probe bar as shown in FIG. 11.

Whether a cell is a non-defective product or a defective product is determined on the basis of the result of the I-V measurement of the cell. A cell determined as a defective product may be discarded. In the case where a cell is slightly defective, and can be repaired, the cell may be repaired, followed by performing I-V measurement again to determine whether the cell is a non-defective product or not. If a defective cell occurs, it is preferable that a cause of the defectiveness is specified, and fed back to the production process to prevent further occurrence of a defective product. Preferably, only cells determined as non-defective products are subjected to a modularization process. In modularization, a wiring member is mounted onto cells determined as non-defective products. Thereafter, examination such as I-V measurement is performed as necessary, followed by encapsulating the cells.

Since I-V measurement of the solar cell of the present invention is easy, I-V measurement can be performed after preparation of cells and before modularization. Thus, modularization can be performed using only non-defective products. Thus, occurrence of defective products is reduced, so that the production cost can be reduced.

Embodiments in which first finger electrodes and second finger electrodes are alternately arranged has been described above. The solar cell of the present invention is not limited to the embodiments described above, and can be applied to other embodiments.

Figure 12:
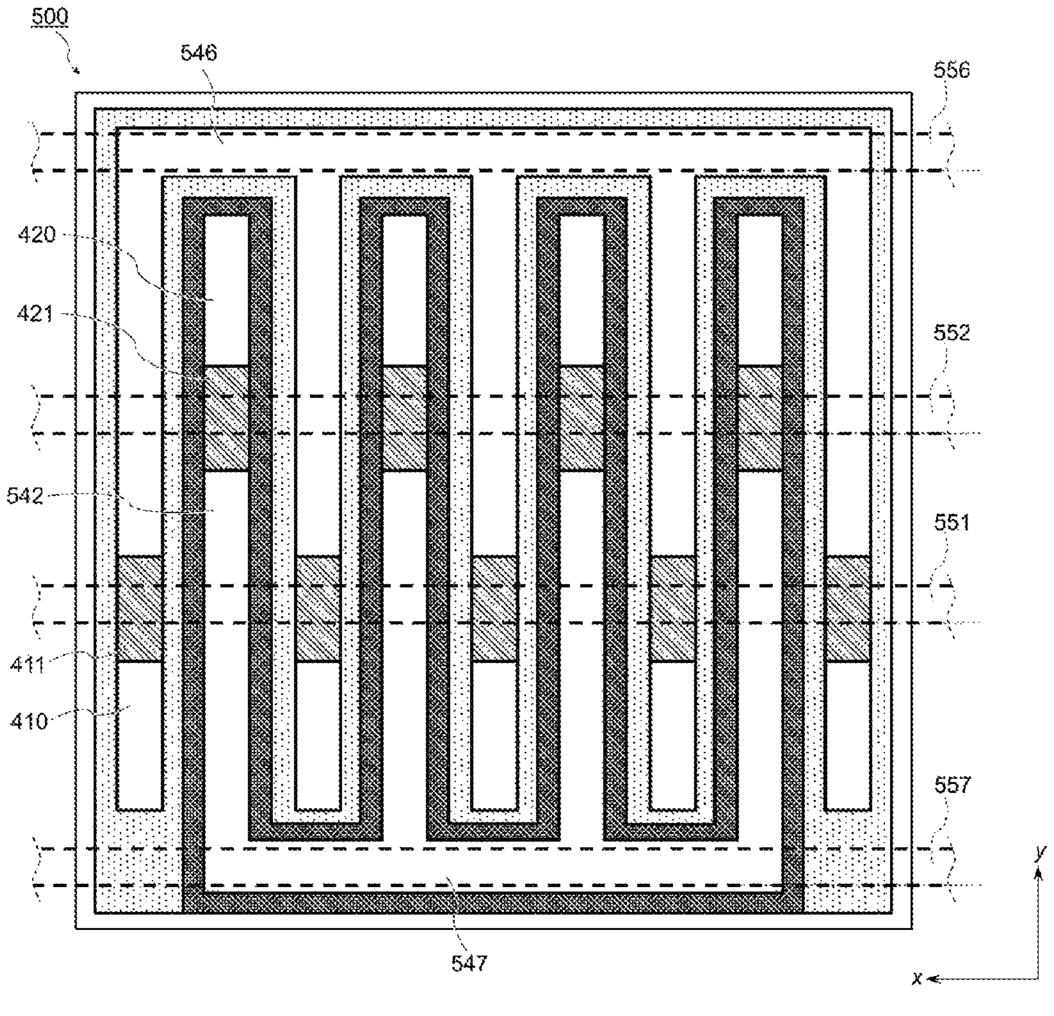
FIG. 12 is a plan view of a solar cell of one embodiment.

For example, when the first electrode and the second electrode are spaced apart from each other, a plurality of finger electrodes may be connected through bus bar electrodes 546 and 547 as in a solar cell 500 shown in FIG. 12. In the solar cell 500, the wiring-mounting electrode section 411 of the first finger electrode is connected to a wiring member 551, and the wiring-mounting electrode section 421 of the second finger electrode is connected to a wiring member 552. The bus bar electrode 546 extending in the x direction and coupling first finger electrodes may be connected to a wiring member 556, and the bus bar electrode 547 coupling second finger electrodes may be connected to a wiring member 557. The electrode height of the bus bar electrode section may be equivalent to or larger than the electrode height of each of the non-mounting electrode sections 410 and 420.

The wiring-mounting electrode section having an electrode height larger than that of the non-mounting electrode section is not required to be provided on both the first electrode and the second electrode, and only the first electrode may have the wiring-mounting electrode section. The first electrode and the second electrode are not required to be alternately arranged. For example, as in a solar cell 600 shown in FIG. 13, a first electrode 641 may be arranged in the form of islands in a region provided with a second electrode 642.

Figure 13:
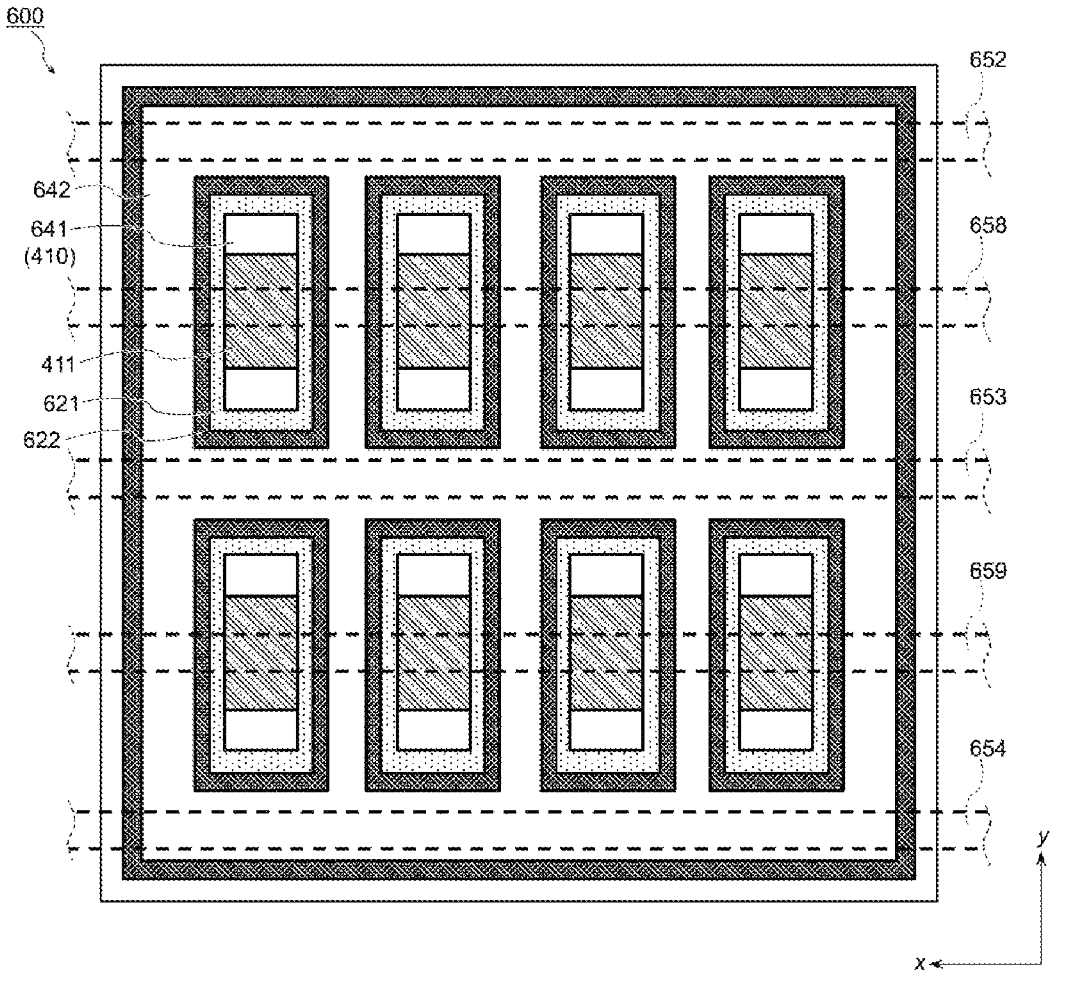
FIG. 13 is a plan view of a solar cell of one embodiment.

In the solar cell 600, a first conductivity-type layer 621 is arranged in the form of isolated islands inside a region of a second conductivity-type layer 622, and the first electrode 641 and the second electrode 642 are formed on the first conductivity-type layer 621 and the second conductivity-type layer 622, respectively. In the solar cell 600, there are many in-plane sections where the second electrode is connected to form a continuous region. Thus, even when the second electrode is not provided with the wiring-mounting electrode section, second wiring members 652, 653 and 654 can be arranged in such a manner that the second wiring members are not in contact with the first electrode, and connect only the second electrode as shown in FIG. 13.

Each of a plurality of first electrodes 641 arranged in the form of isolated islands has the wiring-mounting electrode section 411. The wiring-mounting electrode sections of a plurality of first electrodes arranged side by side in first direction (x direction) are connected to first wiring members 658 and 659. Preferably, a plurality of first electrodes in the form of islands is provided side by side in a direction (x direction) perpendicular to the extending direction of the first electrode (y direction) for facilitating connection of the solar cell to other solar cell through the wiring member.

The first electrode extending direction and the second electrode extending direction are not necessarily parallel to or perpendicular to the edge of the substrate. The first electrode and the second electrode do not necessarily extend linearly, and may have a bend section as shown in FIG. 14.

Figure 14:
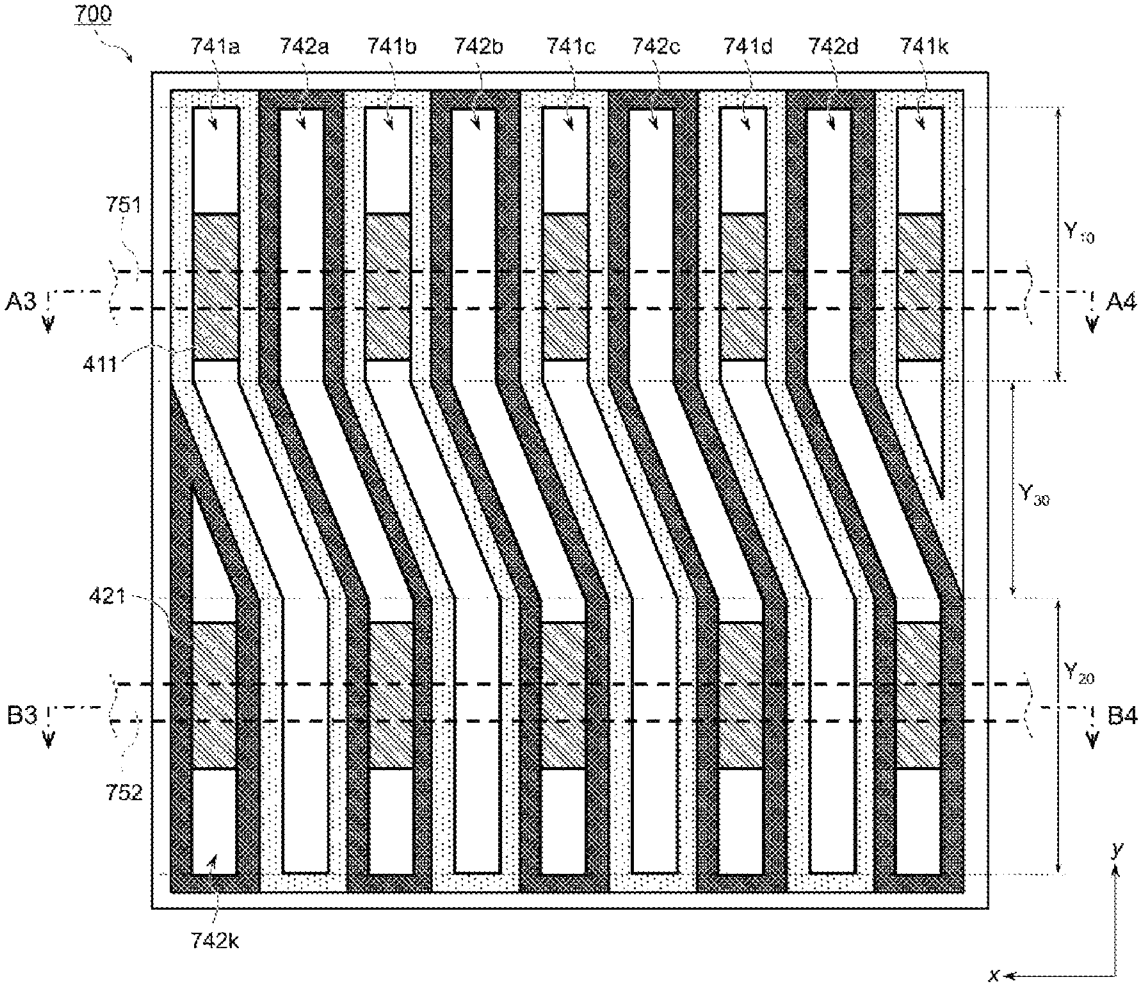
FIG. 14 is a plan view of a solar cell of one embodiment.

In a solar cell 700 shown in FIG. 14, finger electrodes diagonally extend in a region $Y_{30}$ at the central part of a substrate in the y direction. In regions $Y_{10}$ and $Y_{20}$, finger electrodes extend in the y direction. Thus, first finger electrodes 741*a* to 741*d* and second finger electrodes 742*a* to 742*d* each have a bend shape in plan view.

A first finger electrode 741*k* is provided at one end of the region $Y_{10}$ in the x direction, and a second finger electrode 742*k* is provided at the other end of the region $Y_{20}$ in the x direction. The first finger electrodes 741*a* to 741*d* and 741*k* have the wiring-mounting electrode section 411 having a large electrode height in the region $Y_{10}$. The second finger electrodes 742*a* to 742*d* and 742*k* have the wiring-mounting electrode section 421 having a large electrode height in the region $Y_{20}$. In the region $Y_{10}$ and the region $Y_{20}$, the first finger electrodes and the second finger electrodes are arranged alternately along a direction (x direction) perpendicular to the extending direction (y direction) of the finger electrodes.

Figure 15A:
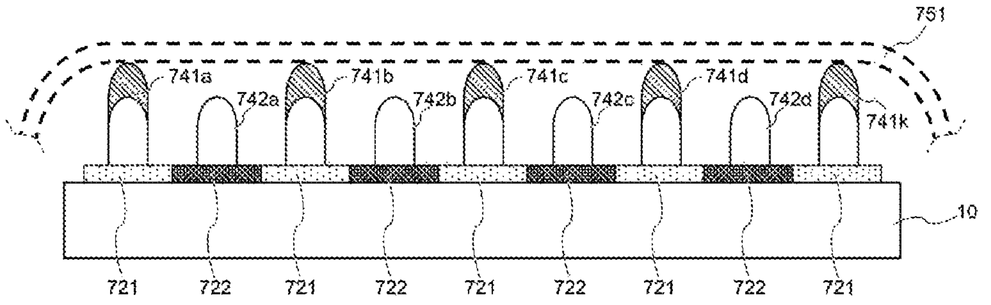
FIG. 15A is a sectional view taken along line A3-A4 in FIG. 14.

In the region $Y_{10}$, the first finger electrode is disposed at both ends in the x direction. When a first wiring member 751 is mounted to the wiring-mounting electrode section 411 of the first finger electrode provided in the region $Y_{10}$, and pressing is then performed for encapsulation etc., the wiring member 751 may be deformed so as to bend toward the semiconductor substrate 10 side at the end part of the cell (in a gap between the cell and an adjacent cell and near the gap) as shown in the sectional view taken along line A3-A4 (FIG. 15A). In the region $Y_{10}$, the first finger electrodes 741*a* and 741*k* exist at both ends in the x direction, and therefore contact between the wiring member 751 and the semiconductor substrate 10 can be prevented even when the wiring member bends. Even if the wiring member and the substrate come into contact with each other, leakage hardly occurs because the first conductivity-type layer 721 provided at the end part is identical to the semiconductor layer provided under the first finger electrodes 741*a* and 741*k*.

Figure 15B:
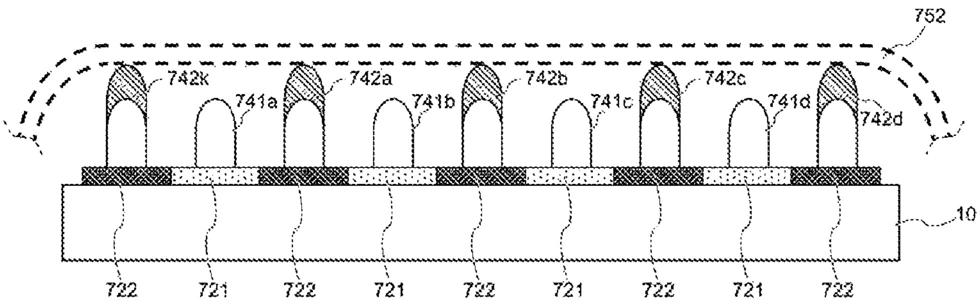
FIG. 15B is a sectional view taken along line B3-B4 in FIG. 14.

In the region $Y_{20}$, the second finger electrode is disposed at both ends in the x direction. Even when after the second wiring member 752 is mounted to the wiring-mounting electrode section 421 of the second finger electrode provided in the region $Y_{20}$, the wiring member 752 is deformed so as to bend toward the semiconductor substrate 10 side as shown in the sectional view taken along line B3-B4 (FIG. 15B), the second finger electrodes 742*k* and 742*d* exist at both ends in the x direction in the region $Y_{20}$. Thus, contact between the wiring member 751 and the semiconductor substrate 10 can be prevented. Even if the wiring member and the substrate come into contact with each other, leakage hardly occurs because the second conductivity-type layer 722 provided at the end part is identical to the semiconductor layer provided under the second finger electrodes 742*k* and 742*d*.

When the region $Y_{10}$ having the first electrode at both ends and the region $Y_{20}$ having the second electrode at both ends exist along a direction (x direction) in which first finger electrodes and second finger electrodes are alternately arranged as described above, leakage caused by the wiring member can be prevented, and therefore a module having high conversion characteristics is obtained.

There may exist a plurality of regions where the first electrode and the second electrode are alternately arranged along first direction, and the first electrode exists at both ends. There may exist a plurality of regions where the first electrode and the second electrode are alternately arranged along the first direction, and the second electrode exists at both ends. For example, a plurality of regions having the first electrode at both ends in the x direction and regions having the second electrode at both ends in the x direction can be made to exist by providing finger electrodes having a plurality of bend sections in plan view as in a solar cell 701 shown in FIG. 16.

Figure 16:
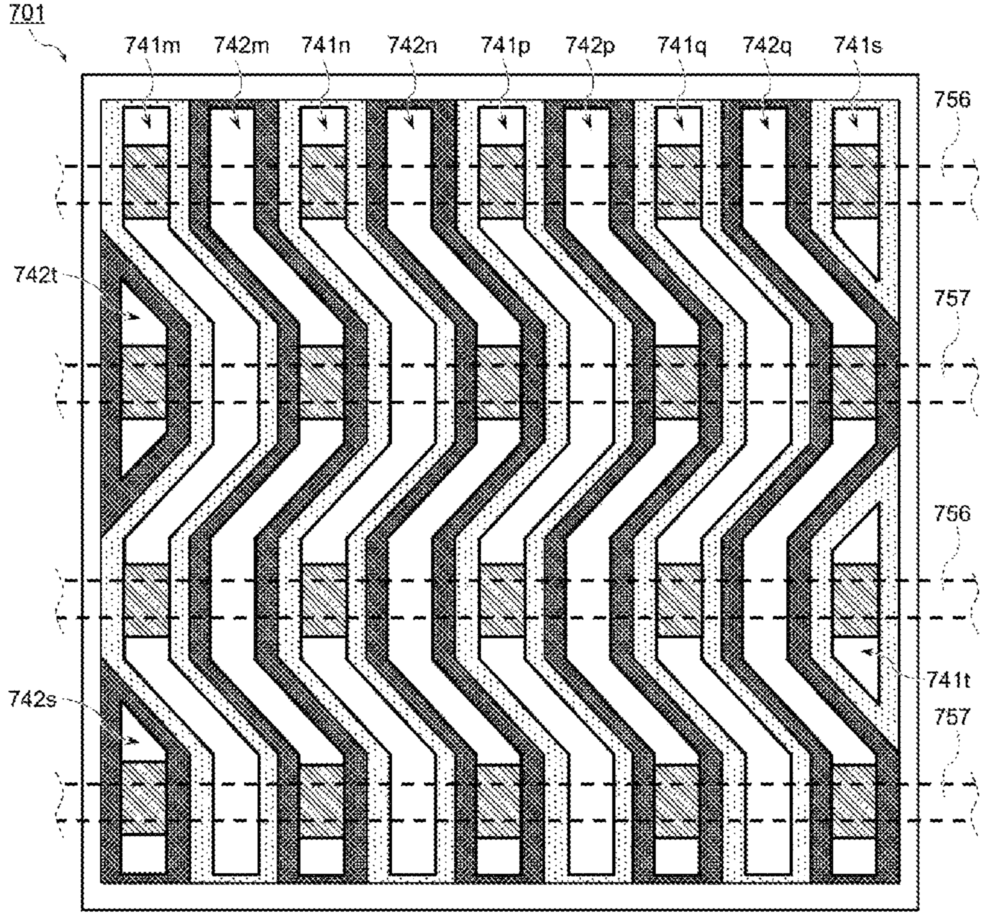
FIG. 16 is a plan view of a solar cell of one embodiment.

In FIGS. 14 and 16, and other drawings, the first conductivity-type layer and the second conductivity-type layer are not provided on the peripheral edge of the semiconductor substrate. These semiconductor layers may be provided on the peripheral edge of the substrate. By providing a semiconductor layer on the peripheral edge of the substrate, the effective power generation area can be increased, and therefore conversion efficiency can be improved. When, as shown in FIGS. 14 and 16, regions having the first electrode at both ends and regions having the second electrode at both ends exist along first direction, and the electrode existing at both ends is provided with a wiring-mounting electrode section, leakage does not occur even if the semiconductor layer provided on the peripheral edge of the substrate comes into contact with the wiring member. Therefore, a module having high conversion efficiency is obtained.

Figure 17:
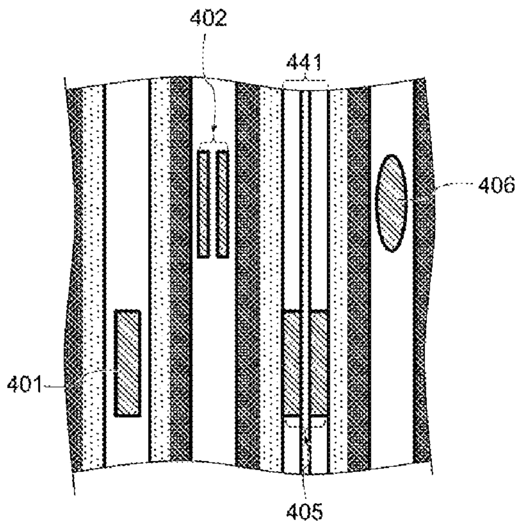
FIG. 17 is a plan view for explaining the shapes of an electrode and a wiring-mounting electrode section.

The shape and arrangement of each of the first electrode and the second electrode can be variously set as described above. The shape of the wiring-mounting electrode section of each of the first electrode and the second electrode can be arbitrarily set. The width of the wiring-mounting electrode section 401 may be smaller than the electrode width as shown in FIG. 17. The shape of the wiring-mounting electrode section is not particularly limited, and may be an elliptical shape like the shape of a wiring-mounting electrode section 406, a bend shape, or the like. The wiring-mounting electrode section is not required to be a single structure, and may have gaps like a wiring-mounting electrode section 402. By providing gaps in the electrode width direction in the wiring-mounting electrode section, the use amount of materials can be reduced to contribute to reduction of the production cost of the solar cell. The electrode may be divided into a plurality of parts on one semiconductor layer as in an electrode 441. When the electrode is divided in the width direction, it is preferable that the electrode is divided near the center in the width direction. The divider width (the width of a groove section which is not provided with the electrode) is not particularly limited, and can be set according to, for example, the width of the whole electrode. When the divider width is excessively large, an increase in series resistance due to reduction of the electrode area may no longer be negligible. Thus, the divider width is preferably about 0.5 μm to 5 μm.

DESCRIPTION OF REFERENCE CHARACTERS

10 semiconductor substrate
21, 22 conductive semiconductor layer
41, 42 electrode
410, 420 non-mounting electrode section
411, 421 wiring-mounting electrode section
51, 52 wiring member
100 solar cell

What is claimed is:

1. A solar cell comprising:

a semiconductor substrate comprising a light-receiving surface and a back surface;

a plurality of first conductivity-type layers and a plurality of second conductivity-type layers, each provided on the back surface of the semiconductor substrate;

a plurality of first electrodes, each provided on each of the first conductivity-type layers; and a plurality of second electrodes, each provided on each of the second conductivity-type layers, wherein the solar cell has no electrode on the light-receiving surface of the semiconductor substrate, wherein the first electrode and the second electrode are spaced apart from each other, wherein each of the first electrodes comprises: a non-mounting electrode section; and a wiring-mounting electrode section having an electrode height larger than an electrode height of the non-mounting electrode section, wherein each of the second electrodes comprises: a non-mounting electrode section; and a wiring-mounting electrode section having an electrode height larger than an electrode height of the non-mounting electrode section, wherein the plurality of the first electrodes and the plurality of the second electrodes extend in parallel, wherein the first electrode and the second electrode are arranged alternately along a direction perpendicular to an extending direction of the electrodes, wherein the solar cell comprises:

a region having the first electrode at each end of the semiconductor substrate in the direction perpendicular to the extending direction of the electrodes; and a region having the second electrode at each end of the semiconductor substrate in the direction perpendicular to the extending direction of the electrodes, wherein each of the second electrodes is disposed between two adjacent first electrodes in the region having the first electrode at each end, and each of the first electrodes is disposed between two adjacent second electrodes in the region having the second electrode at each end, wherein the wiring-mounting electrode sections provided on the first electrodes in the region having the first electrode at each end are arranged in a straight line in the direction perpendicular to the extending direction of the electrodes, wherein a first straight imaginary line connects each top of the wiring-mounting electrode sections provided on the first electrodes in the region having the first electrode at each end, wherein the first straight imaginary line traverses over the plurality of the second electrodes and is located at least 1 μm above each top of the second electrodes, wherein the wiring-mounting electrode sections provided on the second electrodes in the region having the second electrode at each end are arranged in a straight line in the direction perpendicular to the extending direction of the electrodes, wherein a second straight imaginary line connects each top of the wiring-mounting electrode sections provided on the second electrodes in the region having the second electrode at each end, and wherein the second straight imaginary line traverses over the plurality of the first electrodes and is located at least 1 μm above each top of the first electrodes.

2. The solar cell according to claim 1, wherein each of the first electrodes comprises a plurality of the wiring-mounting electrode sections, and wherein the first straight imaginary line connects the top of the wiring-mounting electrode section in one of the two adjacent first electrodes and the top of the wiring-mounting electrode section that is closest among the plurality of the wiring-mounting electrode sections in the other adjacent first electrode.

3. The solar cell according to claim 1, wherein each of the second electrodes comprises a plurality of the wiring-mounting electrode sections, and wherein the second straight imaginary line connects the top of the wiring-mounting electrode section in one of the two adjacent second electrodes and the top of the wiring-mounting electrode section that is closest among the plurality of the wiring-mounting electrode sections in the other adjacent second electrode.

4. A solar cell module, comprising:

the solar cell according to claim 1; and a first wiring member that is electrically mounted to the wiring-mounting electrode section provided on each of the first electrodes, wherein the first wiring member electrically connects the plurality of the first electrodes therethrough.

5. A solar cell module, comprising:

the solar cell according to claim 1;

a first wiring member that is electrically mounted to the wiring-mounting electrode section provided on each of the first electrodes; and a second wiring member that is electrically mounted to the wiring-mounting electrode section provided on each of the second electrodes, wherein the first wiring member electrically connects the plurality of the first electrodes therethrough, and wherein the second wiring member electrically connects the plurality of the second electrodes therethrough.

6. The solar cell according to claim 1, wherein the first straight imaginary line is located at least 5 μm above each top of the second electrodes.

7. The solar cell according to claim 1, wherein the non-mounting electrode section of each of the first electrodes has a height $H_0$ and the wiring-mounting electrode section of each of the first electrodes has an electrode height $H_1$, wherein a value of $H_1$-$H_0$ ranges from 1 to 150 μm.

8. The solar cell according to claim 1, wherein the second straight imaginary line is located at least 5 μm above each top of the first electrodes.

9. The solar cell according to claim 1, wherein the non-mounting electrode section of each of the second electrodes has a height $H_0$ and the wiring-mounting electrode section of each of the second electrodes has an electrode height $H_1$, wherein a value of $H_1$-$H_0$ ranges from 1 to 150 μm.

10. The solar cell according to claim 1, wherein each of the first electrodes and each of the second electrodes have a bend section that extends diagonally and has a bend shape in a plane view.

* * * * *